United States Patent
Peng et al.

(10) Patent No.: US 12,219,879 B2
(45) Date of Patent: *Feb. 4, 2025

(54) GRADIENT PROTECTION LAYER IN MTJ MANUFACTURING

(71) Applicant: Taiwan Semiconductor Manufacturing Co., Ltd., Hsinchu (TW)

(72) Inventors: Tai-Yen Peng, Hsinchu (TW); Yu-Shu Chen, Hsinchu (TW); Sin-Yi Yang, Taichung (TW); Chen-Jung Wang, Hsinchu (TW); Chien Chung Huang, Taichung (TW); Han-Ting Lin, Hsinchu (TW); Jyu-Horng Shieh, Hsinchu (TW); Qiang Fu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/521,399

(22) Filed: Nov. 28, 2023

(65) Prior Publication Data
US 2024/0099150 A1 Mar. 21, 2024

Related U.S. Application Data

(60) Continuation of application No. 17/869,335, filed on Jul. 20, 2022, now Pat. No. 11,856,865, which is a
(Continued)

(51) Int. Cl.
*H10N 50/01* (2023.01)
*H10N 50/80* (2023.01)

(52) U.S. Cl.
CPC ............ *H10N 50/01* (2023.02); *H10N 50/80* (2023.02)

(58) Field of Classification Search
CPC .............................. H10N 50/01; H10N 50/80
See application file for complete search history.

(56) References Cited

U.S. PATENT DOCUMENTS 8,796,814 B2 * 8/2014 Ogihara ................ H10N 50/01
257/E29.323
9,196,825 B2 11/2015 Huang et al.
(Continued)

FOREIGN PATENT DOCUMENTS

CN 104425706 A 3/2015
JP 2013201343 A 10/2013
(Continued)

*Primary Examiner* — Mark W Tornow
(74) *Attorney, Agent, or Firm* — Slater Matsil, LLP

(57) ABSTRACT

A method includes forming Magnetic Tunnel Junction (MTJ) stack layers, which includes depositing a bottom electrode layer; depositing a bottom magnetic electrode layer over the bottom electrode layer; depositing a tunnel barrier layer over the bottom magnetic electrode layer; depositing a top magnetic electrode layer over the tunnel barrier layer; and depositing a top electrode layer over the top magnetic electrode layer. The method further includes patterning the MTJ stack layers to form a MTJ; and performing a passivation process on a sidewall of the MTJ to form a protection layer. The passivation process includes reacting sidewall surface portions of the MTJ with a process gas comprising elements selected from the group consisting of oxygen, nitrogen, carbon, and combinations thereof.

20 Claims, 14 Drawing Sheets

Related U.S. Application Data continuation of application No. 17/120,613, filed on Dec. 14, 2020, now Pat. No. 11,411,176, which is a division of application No. 16/170,750, filed on Oct. 25, 2018, now Pat. No. 10,868,239.

(56) References Cited

U.S. PATENT DOCUMENTS

| | | | |
|---|---|---|---|
| 9,362,490 B1 | 6/2016 | Xiao | |
| 9,564,582 B2 | 2/2017 | Pakala et al. | |
| 10,374,144 B2 | 8/2019 | Tan et al. | |
| 10,529,916 B2 | 1/2020 | Huang et al. | |
| 10,868,239 B2 * | 12/2020 | Peng | H10N 50/01 |
| 11,411,176 B2 | 8/2022 | Peng et al. | |
| 2009/0256220 A1 | 10/2009 | Horng et al. | |
| 2013/0032907 A1 * | 2/2013 | Satoh | H10N 50/01 257/E29.323 |
| 2016/0020390 A1 | 1/2016 | Chang et al. | |
| 2016/0308112 A1 * | 10/2016 | Tan | H10N 50/01 |
| 2017/0125663 A1 | 5/2017 | Nagel et al. | |
| 2017/0263861 A1 * | 9/2017 | Park | H10B 61/00 |
| 2017/0301857 A1 | 10/2017 | Mudivarthi et al. | |
| 2018/0040809 A1 | 2/2018 | Moon | |
| 2018/0269385 A1 | 9/2018 | Iwata et al. | |

FOREIGN PATENT DOCUMENTS

| | | |
|---|---|---|
| KR | 20150026828 A | 3/2015 |
| KR | 20160009476 A | 1/2016 |
| KR | 20160130484 A | 11/2016 |
| TW | 201709573 A | 3/2017 |

\* cited by examiner

GRADIENT PROTECTION LAYER IN MTJ MANUFACTURING

PRIORITY CLAIM AND CROSS-REFERENCE

This application is a continuation of U.S. patent application Ser. No. 17/869,335, entitled "Gradient Protection Layer in MTJ Manufacturing," and filed Jul. 20, 2022, which is a continuation of U.S. patent application Ser. No. 17/120,613, entitled "Gradient Protection Layer in MTJ Manufacturing," and filed Dec. 14, 2020, now U.S. Pat. No. 11,411,176, issued Aug. 9, 2022, which is a divisional of U.S. patent application Ser. No. 16/170,750, entitled "Gradient Protection Layer in MTJ Manufacturing," filed on Oct. 25, 2018, now U.S. Pat. No. 10,868,239 issued Dec. 15, 2020, which applications are incorporated herein by reference.

BACKGROUND

Semiconductor memories are used in integrated circuits for electronic applications, including radios, televisions, cell phones, and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to indicate bit values.

A typical MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, a plurality of blanket layers are deposited first. The blanket layers are then patterned through a photo etching to form the MTJ stack. A cap dielectric layer is then formed to include some portions on the sidewalls, and possibly additional portions over the top surface, of the MTJ stacks. The MTJ stack is protected by the cap dielectric layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12A are cross-sectional views of intermediate stages in the formation of some Magneto-Resistive Random Access Memory (MRAM) cells in accordance with some embodiments.

DETAILED DESCRIPTION

Figure 1:
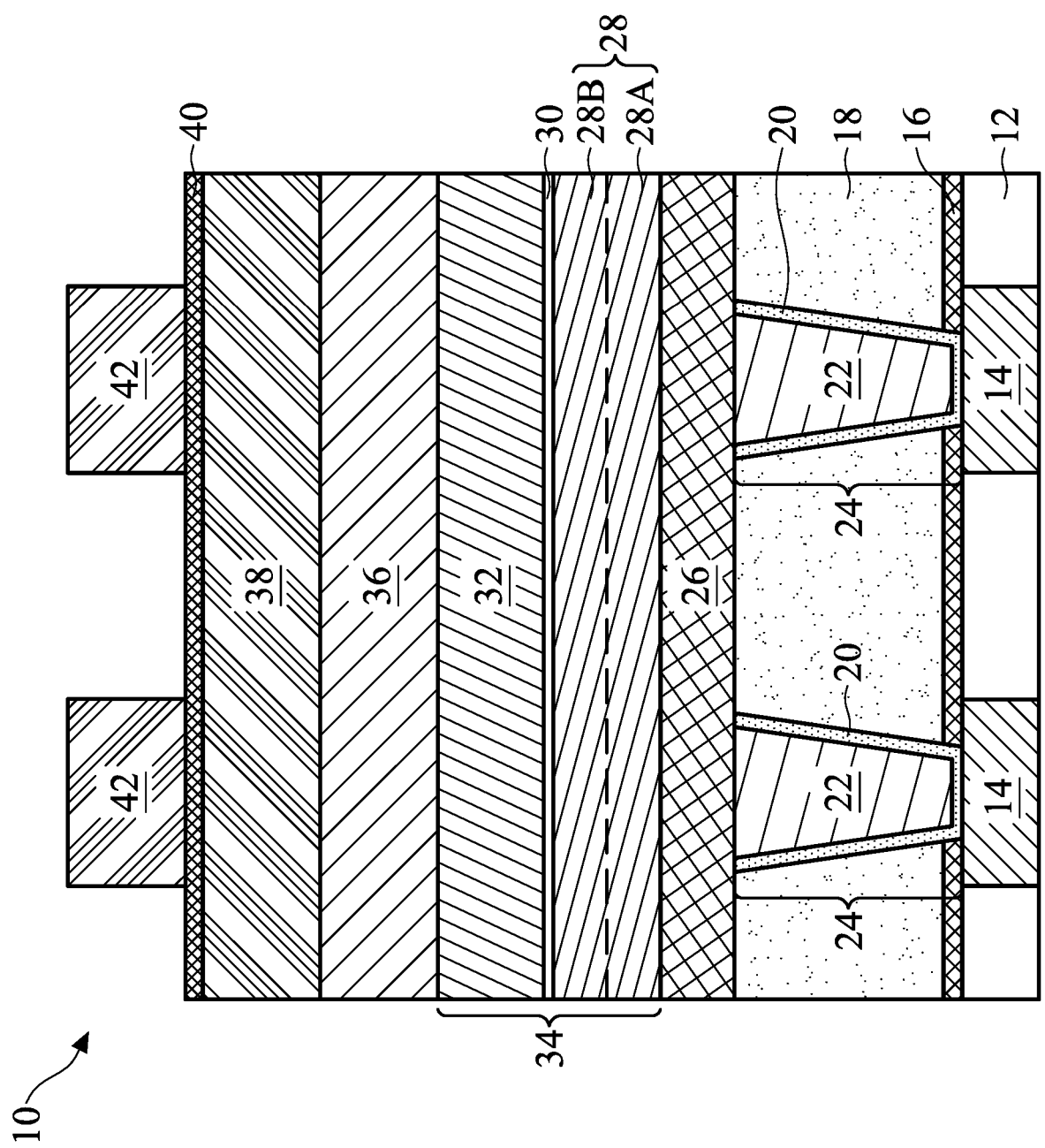

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magneto-Resistive Random Access Memory (MRAM) cells and the methods of forming the same are provided in accordance with some embodiments. The intermediate stages of forming the MRAM cells are illustrated in accordance with some embodiments. Some variations of some embodiments are discussed. Throughout the various views and illustrative embodiments, like reference numbers are used to designate like elements. In accordance with some embodiments of the present disclosure, protection layers are formed at various stages to protect the sidewalls of Magnetic Tunnel Junction (MTJ) stacks in the MRAM cells as well as the sidewalls of top and bottom electrodes, so that the electrical shorting caused by the re-sputtering occurring during the etching of various layers is avoided. Furthermore, the formed protection layer(s) may act as cap dielectric layers for protecting the sidewalls of the MTJ stacks, so that there is no need to form cap dielectric layers on the sidewalls of the MTJ stacks in some embodiments.

FIGS. 1 through 12A illustrate the cross-sectional views of intermediate stages in the formation of MRAM cells in accordance with some embodiments of the present disclosure. The processes shown in FIGS. 1 through 12A are also reflected schematically in the process flow shown in FIG. 13.

Referring to FIG. 1, wafer 10 is formed. Wafer 10 may include a substrate (not shown), which may be a semiconductor substrate. The substrate may be formed of silicon, silicon germanium, III-V compound semiconductor, or the like. In accordance with some embodiments of the present disclosure, the substrate is a bulk silicon substrate. Active devices (not shown) such as transistors and diodes and passive devices (not shown) such as capacitors, inductors, and resistors may be formed in wafer 10. Dielectric layer 12 is formed over the substrate. In accordance with some embodiments of the present disclosure, dielectric layer 12 is a low-k dielectric layer having a k value lower than about 3.0, for example. Dielectric layer 12 may also be formed of another dielectric material such as silicon oxide, silicon nitride, Phospho-Silicate Glass (PSG), Boron Silicate Glass (BSG), Boron-Doped Phospho-Silicate Glass (BPSG), or the like. Conductive features 14 are formed in dielectric layer 12. In accordance with some embodiments of the present disclosure, conductive features 14 are metal lines (such as word lines or bit lines), metal vias, contact plugs, doped semiconductor strips, or the like. Metal features 14 may be formed of metals such as copper, aluminum, tungsten, cobalt, or the like, or metal alloys thereof.

Over conductive features 14 may be etch stop layer 16, dielectric layer 18, and conductive vias 24. In accordance with some embodiments of the present disclosure, etch stop layer 16 is formed of a dielectric layer that is different from the overlying dielectric layer 18. For example, etch stop layer 16 may be formed of aluminum nitride, aluminum oxide, silicon oxide, silicon nitride, silicon oxynitride, silicon carbide, or the like. Etch stop layer 16 may also be a composite layer formed of a plurality of dielectric layers. For example, etch stop layer 16 may include a metal oxide layer, a metal nitride layer over the metal oxide layer, and may or may not include a metal oxynitride layer or a metal carbo-nitride layer over the metal nitride layer.

Dielectric layer 18 may be formed of silicon oxide deposited using, e.g., a Chemical Vapor Deposition (CVD) method with Tetra Ethyl Ortho Silicate (TEOS) as a precursor. Dielectric layer 18 may be formed using PSG, BSG, BPSG, Undoped Silicate Glass (USG), Fluorosilicate Glass (FSG), SiOCH, flowable oxide, a porous oxide, or the like, or combinations thereof in accordance with other embodiments. Dielectric layer 18 may also be formed of a low-k dielectric material with a k value lower than about 3.0, for example.

Vias 24 are formed in dielectric layer 18 and penetrate through etch stop layer 16. In accordance with some embodiments of the present disclosure, Vias 24 include conductive barrier layers 20 and conductive regions 22 over the bottom portion of conductive barrier layers 20. Conductive barrier layers 20 may be formed of titanium, titanium nitride, tantalum, tantalum nitride, cobalt, or the like. Conductive regions 22 may be formed of metals such as copper, aluminum, tungsten, cobalt, or the like, or alloys of the metals. The formation of vias 24 may include etching dielectric layer 18 and etch stop layer 16 to form via openings, forming a blanket conductive barrier layer extending into the via openings, depositing a metallic material over the blanket conductive barrier layer, and performing a planarization process such as a Chemical Mechanical Polish (CMP) process or a mechanical grinding process to remove excess portions of the blanket conductive barrier layer and the metallic material.

Next, a bottom electrode layer, a MTJ stack, and a top electrode layer are formed. The respective process is illustrated as process 202 in the process flow 200 shown in FIG. 13. Further referring to FIG. 1, bottom electrode layer 26 is deposited. In accordance with some embodiments of the present disclosure, bottom electrode layer 26 is formed as a blanket layer, and may be formed using CVD, Physical Vapor Deposition (PVD), Electro-Chemical Plating (ECP), Electroless plating, or the like. The material of bottom electrode layer 26 may include Cu, Al, Ti, Ta, W, Pt, Ni, Cr, Ru, TiN, TaN, combinations thereof, and/or multi-layers thereof. For example, bottom electrode layer 26 may include a titanium layer and a copper layer over the titanium layer.

Over bottom electrode layer 26, MTJ layers 34 are formed. In accordance with some embodiments of the present disclosure, MTJ layers 34 include bottom magnetic electrode layer 28, tunnel barrier layer 30 over bottom magnetic electrode layer 28, and top magnetic electrode layer 32 over tunnel barrier layer 30. Magnetic electrode layer 28 may include pinning layer 28A and pinned layer 28B and contacting pinning layer 28A. Top magnetic electrode layer 32 may include a free layer. The neighboring layers in layers 28, 30, and 32 may also be in physical contact with each other. Bottom magnetic electrode layer 28, tunnel barrier layer 30, and top magnetic electrode layer 32 may be deposited using one or more deposition methods such as, CVD, PVD, ALD, or the like.

Pinning layer 28A may be formed of a metal alloy including manganese (Mn) and another metal(s) such as platinum (Pt), iridium (Ir), rhodium (Rh), nickel (Ni), palladium (Pd), iron (Fe), osmium (Os), or the like. Accordingly, pinning layer 28A may be formed of PtMn, IrMn, RhMn, NiMn, PdPtMn, FeMn, Os, Mn, or the like. Pinned layer 28B may be formed of a ferromagnetic material with a greater coercivity field than top magnetic electrode layer 32, and may be formed of materials such as cobalt iron (CoFe), cobalt iron boron (CoFeB), or the like. In accordance with some embodiment, pinned layer 28B has a Synthetic ferromagnetic (SFM) structure, in which the coupling between magnetic layers is ferromagnetic coupling. Magnetic electrode layer 28 may also adopt a Synthetic Antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, Magnetic electrode layer 28 may have a Co layer and repeated $(Pt/Co)_x$ layers over the Co layer, with x representing repeating number and may be any integer equal to or greater than 1.

Tunnel barrier layer 30 may be formed of MgO, AlO, AlN, or the like. Tunnel barrier layer 30 may have a thickness in the range between about 0.5 nm and about 3 nm.

Top magnetic electrode layer 32 may be formed of a ferromagnetic material such as CoFe, NiFe, CoFeB, CoFeBW, or the like. Top magnetic electrode layer 32 may also adopt a synthetic ferromagnetic structure, which is similar to the SAF structure, with the thickness of the spacer layer adjusted to achieve the ferromagnetic coupling between the separated magnetic metals, i.e., causing the magnetic moment to be coupled in the same direction. The magnetic moment of top magnetic electrode layer 32 is programmable, and the resistance of the resulting MTJ cell is accordingly changed between a high resistance and a low resistance. It is realized that the materials and the structure of MTJ layers 34 may have many variations, which are also within the scope of the present disclosure. For example, layers 28A, 28B, 30, and 32 may be formed in an order inversed from what is shown in FIG. 1. Accordingly, the free layer may be the bottom layer of MTJ layers 34, while the pinning layer may be the top layer.

Top electrode layer 36 is formed over MTJ layers 34. In accordance with some embodiments of the present disclosure, top electrode layer 36 is formed as a blanket layer, and may be formed using CVD, PVD, ECP, electroless (Eless) plating, or the like. The material of top electrode layer 36 may include aluminum, titanium, tantalum, tungsten, or the like, alloys thereof, and/or multi-layers thereof. Top electrode layer 36 may be used as a hard mask in the subsequent patterning of MTJ layer, and may include a conductive layer formed of TiN, Ta, TaN, Ti, Ru, W, Si, alloys thereof, and/or multi-layers thereof. Top electrode layer may also include a dielectric layer over the conductive layer, and the dielectric layer may include TiO, a TEOS oxide, amorphous carbon, photo resist, or other suitable material.

Over top electrode layer 36, a tri-layer is formed, which includes bottom layer 38 (sometimes referred to as a under layer), middle layer 40 over bottom layer 38, and top layer 42 over middle layer 40. In accordance with some embodiments of the present disclosure, bottom layer 38 is formed of a photo resist. Furthermore, bottom layer 38 is crosslinked, and hence is different from typical photo resists used for light exposure. Bottom layer 38 may function as a Bottom Anti-Reflective Coating (BARC) when top layer 42 is light-exposed.

Middle layer 40 may be formed of a material including silicon and oxygen, which may be SiON, for example, while other similar materials may be used. Top layer 42 is formed of a photo resist. Top layer 42 is coated as a blanket layer, and is then patterned in a photo lithography process using a photo lithography mask. In a top view of wafer 10, the remaining portions of top layer 42 may be arranged as an array.

Figure 2:
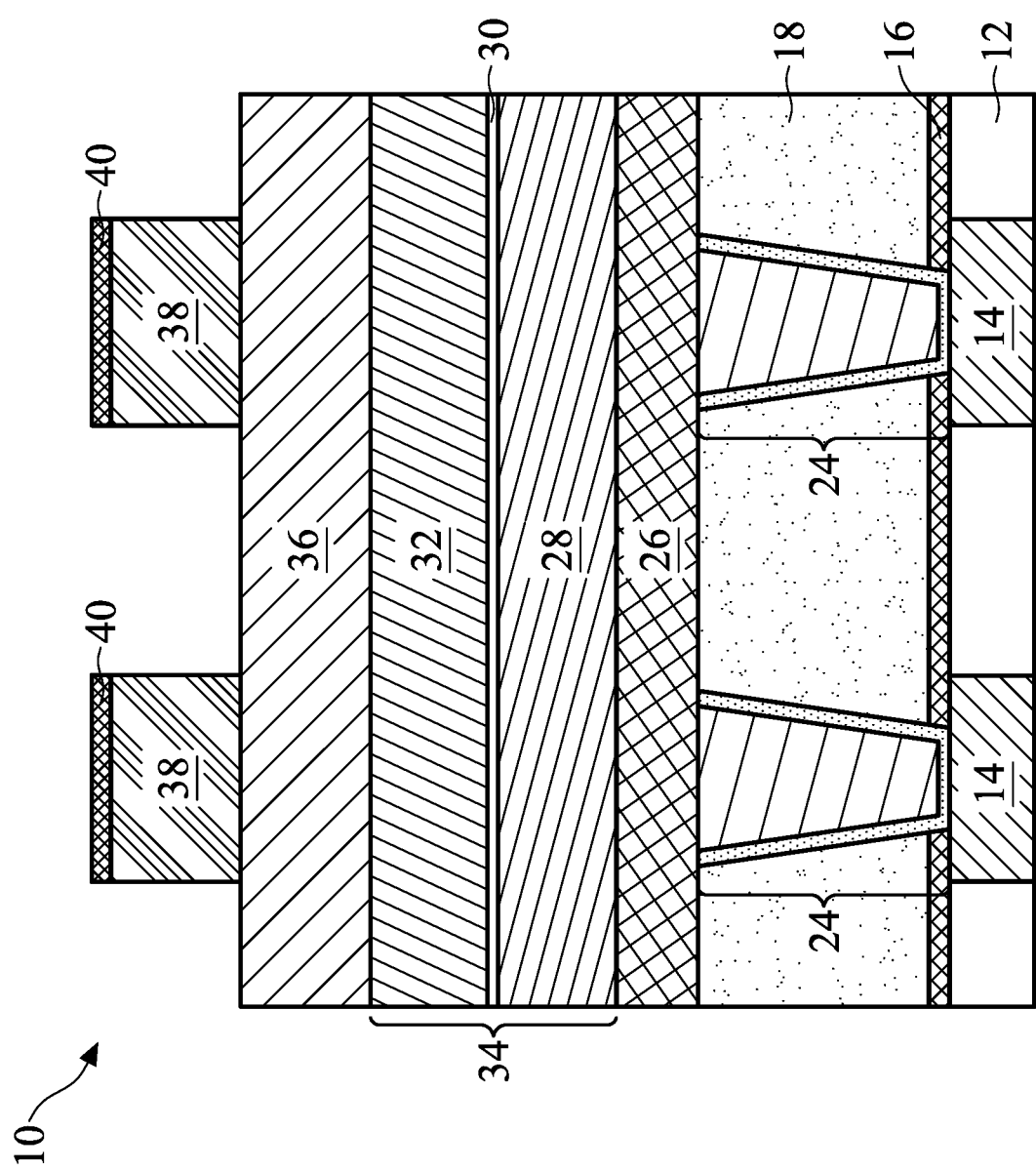
Figure 3:
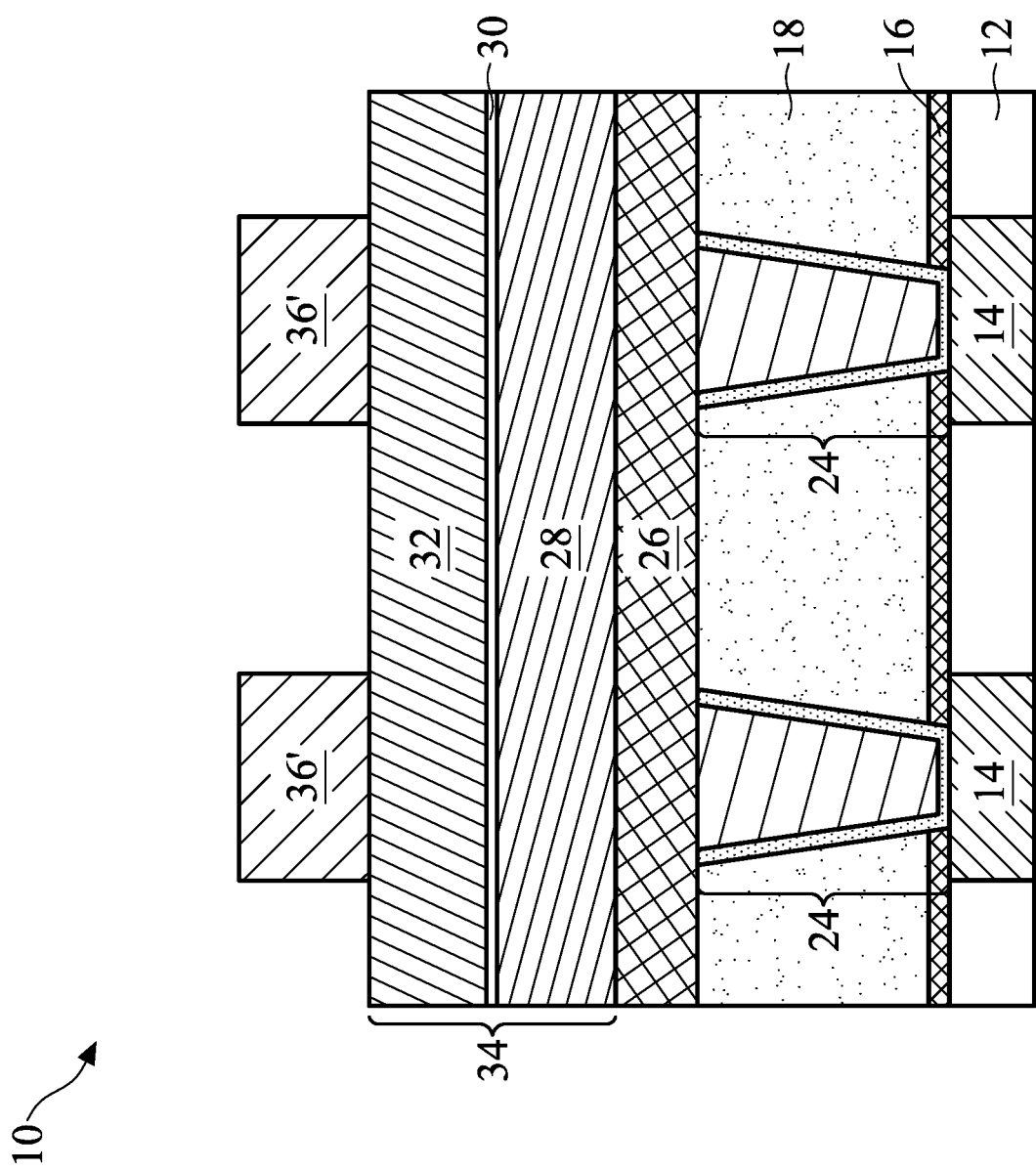

In subsequent steps, the patterned top layer 42 is used as an etching mask to etch and pattern the underlying middle layer 40 and bottom layer 38. The patterned top layer 42 may be consumed in the etching process. The resulting structure is illustrated in FIG. 2. In a subsequent step, the patterned middle layer 40 and bottom layer 38 are used as an etching mask to etch the underlying top electrode layer 36, forming top electrodes 36'. The respective process is illustrated as process 204 in the process flow 200 shown in FIG. 13. The resulting top electrodes 36' are illustrated in FIG. 3. The etching method may include a plasma etching method, which may include reactive Ion Beam Etching (IBE). The etching may be implemented using Glow Discharge Plasma (GDP), Capacitive Coupled Plasma (CCP), Inductively Coupled Plasma (ICP), or the like. After the etching process, the remaining portions of bottom layer 38 and middle layer 40 (if remaining, FIG. 2) are removed.

In accordance with some embodiments of the present disclosure, Reactive Ion Etching (RIE), rather than IBE, may be used in the etching of top electrode layer 36 and underlying layers. RIEs are performed in different tools than the formation of protection layers, as will be discussed in subsequent paragraphs.

In subsequent process steps, a plurality of etching processes and passivation processes are performed, as illustrated in FIGS. 4 through 9. In accordance with some embodiments of the present disclosure, the processes as illustrated in FIGS. 4 through 9 are in-situ performed in the same etching chamber, which is a vacuum chamber under vacuum conditions. The etching chamber is schematically illustrated as chamber 39 in FIG. 4, but is not shown in FIGS. 5 through 9, although these processes may also be performed in etching chamber 39. Furthermore, there may not be vacuum break in these processes. Alternatively stated, from the beginning of the process shown in FIG. 4 to the end of the process shown in FIG. 9, there may not be vacuum break. Rather, the change from one process to another process is achieved by adjusting process conditions such as changing (and/or adjusting the flow rates of) process gases and adjusting powers/voltages. The adjusted powers/voltages may include the source power (sometimes referred to as coil power) when the IBE is used. The adjusted powers/voltages may also include beam accelerator voltage (grid voltage) if IBE is used for etching, or bias voltage if RIE is used for etching. In accordance with other embodiments, there may be vacuum breaks between these processes, and some of these processes may be performed in process chambers other than the etching chamber 39.

Figure 4:
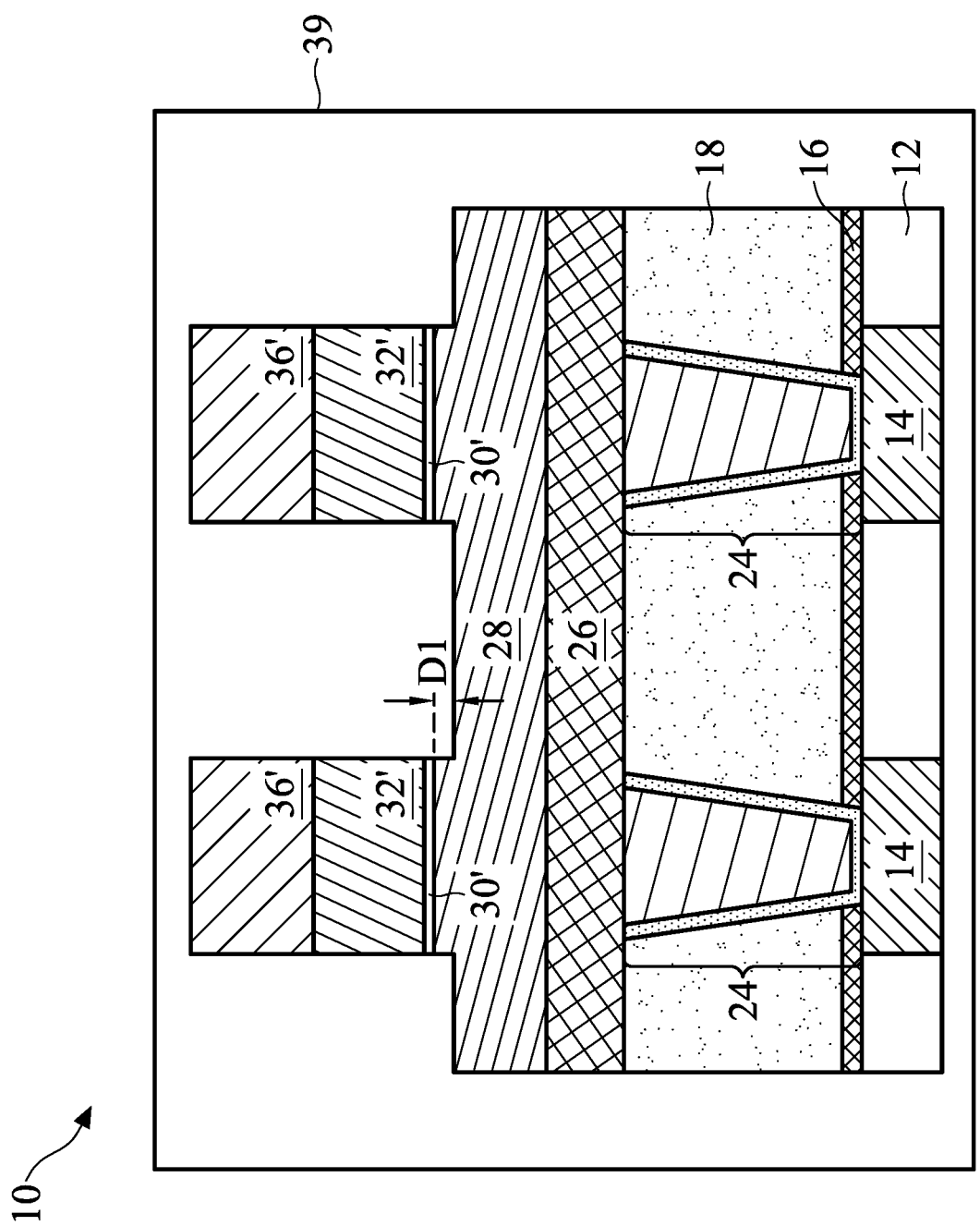

As an initial process of the plurality of etching processes and passivation processes, wafer 10 as illustrated in FIG. 3 is first placed into the etching chamber 39 (FIG. 4). Next, magnetic electrode layer 32 is etching using top electrodes 36' as an etching mask. The respective process is illustrated as process 206 in the process flow 200 shown in FIG. 13. The etching may be performed using reactive ion beam etching, which may involve GDP, ICP, CCP, or the like. As a result of the etching process, magnetic electrode layer 32 is etched-through, forming magnetic electrodes 32'. After the etching of magnetic electrode layer 32, tunnel barrier layer 30 is etched to form tunnel barriers 30'. The respective process is also illustrated as process 206 in the process flow 200 shown in FIG. 13. In accordance with some embodiments of the present disclosure, tunnel barrier layer 30 is etched in the same process for etching magnetic electrode layer 32, and is etched using the same etching gas for etching magnetic electrode layer 32. In accordance with alternative embodiments, tunnel barrier layer 30 may be etched using different etching gases than etching magnetic electrode layer 32.

In accordance with some embodiments of the present disclosure, the etching process gas includes Ar, Kr, Ne, $O_2$, Xe, He, Methanol, or combinations thereof. In accordance with some embodiments of the present disclosure, the etching is performed with the source power in the range between about 200 Watts and about 1,500 Watts if IBE is used, or in the range between about 900 Watts and about 2,000 Watts if RIE is used. The bias voltage may be in the range between about 50 volts and about 1,500 volts if RIE is used. If IBE is used, the grid voltage may be in the range between about 50 volts and about 1,500 voltages also.

After the etching of tunnel barrier layer 30, magnetic electrode layer 28 is exposed. In accordance with some embodiments of the present disclosure, process is controlled to stop as soon as magnetic electrode layer 32 is fully etched and tunnel barrier layer 30 is etched-through. In accordance with alternative embodiments of the present disclosure, process is controlled so that magnetic electrode layer 32 is slightly etched, so that a small portion of sidewall is exposed. Due to process variations or due to the intended light etching, magnetic electrode layer 28 may be recessed slightly. In accordance with some embodiments of the present disclosure, recess depth Di in magnetic electrode layer 28 is smaller than about 3 nm, and may be in the range between about 0 nm and about 5 nm.

After the etching of magnetic electrode layer 32 and tunnel barrier layer 30, process conditions are changed to perform a first passivation process on the exposed features. Accordingly, a first protection layer 46 is formed on the exposed surfaces of the exposed features including magnetic electrode layer 28, tunnel barriers 30', magnetic electrodes 32', and top electrodes 36'. The respective process is illustrated as process 208 in the process flow 200 shown in FIG. 13. In accordance with some embodiments of the present disclosure, the first passivation process is performed in the same process chamber as the etching of magnetic electrode layer 32 and tunnel barrier layer 30, with no vacuum break therebetween. The process gases for the passivation may include an oxygen-containing gas, a nitrogen-containing gas, a carbon-containing gas, or the combinations of these process gases. For example, the process gases may include one or more of $O_2$, $N_2$, CO, $CO_2$, $CH_3OH$, or combinations thereof. The process gases may also include a carrier gas such as Ar, Ne, Kr, Xe, He, or the like, or combinations thereof.

The first passivation process may be performed using a process similar to an etching process, except that the bias power is adjusted to be very low, so that the etching effect is low, and protection layer 46 is formed. Plasma is generated from the process gases, so that at least one, or more, of an oxidation process, a nitridation process, and a carbonation process is resulted, depending on whether the process gases include oxygen, nitrogen, and carbon, respectively, or not. In accordance with some embodiments of the present disclosure, IBE process (and tool) is used, and the first passivation process is performed with the beam accelerator voltage being in the range between about 50 volts and about 200 volts. The bias energy cannot be too low or too high. If the bias energy is too low, the passivation process is too slow, and if the bias energy is too high, the formed protection layer (if any) may be bombarded, and may be removed by the bombardment. In accordance with some embodiments of the present disclosure, the bias energy is adjusted to be the range between about 50 eV and about 200 eV. The first passivation is performed tilted, so that the sidewall portions of the stacked layers are passivated. Ions may impact wafer 10 with tilt angle α1. Tilt angle α1 may be greater than about 20 degrees, and may be in the range between about 10 degrees and about 45 degrees. The tilted first passivation may be performed from opposite directions, as illustrated by arrows 48 shown in FIG. 5. Furthermore, if viewed from the top of wafer 10, the tilted passivation may include four tilted passivation processes, each tilting in a direction. For example, assuming in a plane parallel to the major top surface of wafer 10, the illustrated two tilted passivation processes are tilted in +X and −X directions, then the other two tilted passivation processes can be performed in +Y and −Y directions (not shown), which are perpendicular to the +X and −X direction in the top view of wafer 10. This may be achieved, for example, by tilting the electrostatic chuck on what wafer 10 is placed, and rotating the electrostatic chuck, so that the tilted passivation may be achieved from all tilting directions including the +X, −X, +Y, and −Y directions. Additional tilt implantations may also be added to implant in the +X, −X, +Y, and −Y directions, but not in other directions, and wafer is not rotated during the additional tilt implantations.

The resulting protection layer 46 is a dielectric layer, which is formed due to the reaction of the respective process gas with the surface layers of the exposed features 28, 30', 32', and 36', which surface layers are oxidized, nitridated, and/or carbonized, depending on whether the process gases include oxygen, nitrogen, and carbon, respectively. The composition of protection layer 46 may be identified, for example, using Energy-dispersive X-ray spectroscopy (EDX), Electron energy-loss spectroscopy (EELS), Auger Electron Spectroscopy (AES), or the like. The portions of protection layer 46 on the surfaces of magnetic layer 28 may include the elements (such as Pt, Mn, Ir, Rh, Ni, Pd, Fe, Co, or B, for example) in magnetic layer 28 and one or more of O, N, C, and the like. The portions of protection layer 46 on the surfaces of tunnel barriers 30' may include the elements (Al or Mg, for example) in tunnel barriers 30' and one or more of O, N, C, and the like. The portions of protection layer 46 on the surfaces of magnetic electrodes 32' may include the elements (such as Fe, Co, or B, for example) in magnetic electrode layer 32 and one or more of O, N, C, and the like. The portions of protection layer 46 on the surfaces of top electrodes 36' may include the elements (such as Cu, W, Ti, Ta, or the like) in top electrodes 36' and one or more of O, N, C, and the like. Accordingly, although illustrated as a continuous layer, protection layer 46 may have different compositions in different portions. The thickness T1 of protection layer 46 may be in the range between about 0.5 nm and about 3 nm in accordance with some embodiments.

Figure 6:
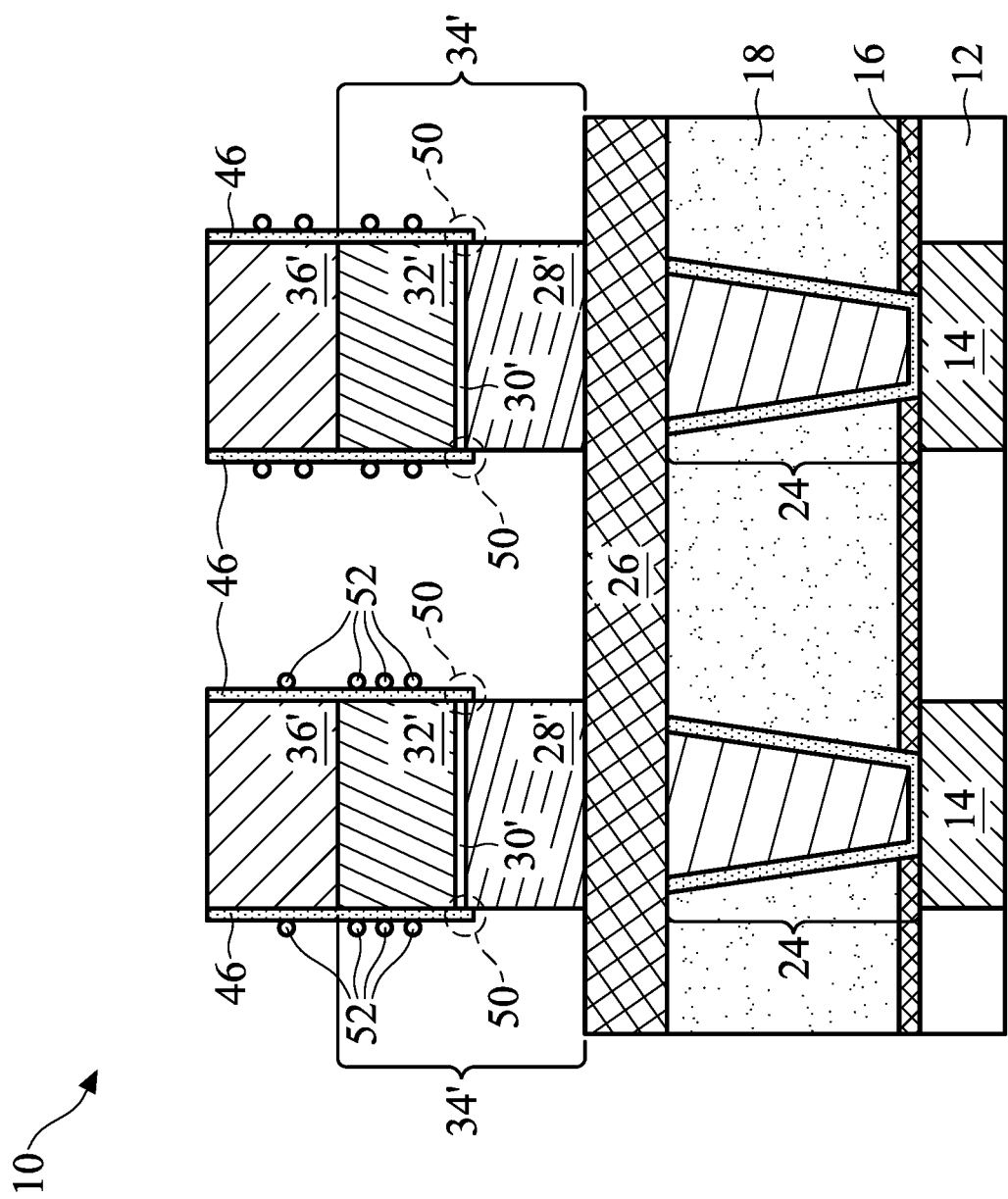

Next, bottom magnetic electrode layer 28 is etched, and magnetic electrodes 28' are formed. The resulting structure is shown in FIG. 6. The respective process is illustrated as process 210 in the process flow 200 shown in FIG. 13. Accordingly, MTJs 34' are formed, with each of the MTJs 34' including bottom magnetic electrode 28' and the corresponding overlying tunnel barrier 30' and top magnetic electrode 32'. The horizontal portions of protection layer 46 are also etched in the respective etching process. Bottom electrode layer 26 is then exposed. The etching may be performed using an ion beam etching process (such as a reactive ion etching process). In accordance with some embodiments of the present disclosure, the etching process gases include Ar, Kr, Ne, O2, Xe, He, Methanol, or combinations thereof. In accordance with some embodiments of the present disclosure, the etching is performed with main power (for generating plasma) in the range between about 200 Watts and about 1,500 Watts. The bias energy may be in the range between about 50 eV and about 1,500 eV.

The etching may cause the re-sputtering of the metallic material of magnetic electrode layer 28, and the re-sputtered material may be deposited on the surfaces of protection layer 46. The re-sputtered material is schematically illustrated as 52 in FIG. 6. It is appreciated that the formation of protection layer 46 advantageously prevents the re-sputtered metallic material from being deposited in the regions marked as 50. If the re-sputtered metallic material is deposited in regions 50, these portions of the re-sputtered metallic material may electrically short magnetic electrodes 28' to the corresponding overlying magnetic electrodes 32', causing degradation, and possibly failure, of the resulting MTJs since the resistance of the resulting MTJs 34' will always be lower than what they should be. With the formation of protection layer 46, the re-sputtered portions of the metallic material are not able to electrically short magnetic electrodes 28' to the corresponding overlying magnetic electrodes 32'. The reliability of the resulting MTJs 34' is thus improved.

Figure 7:
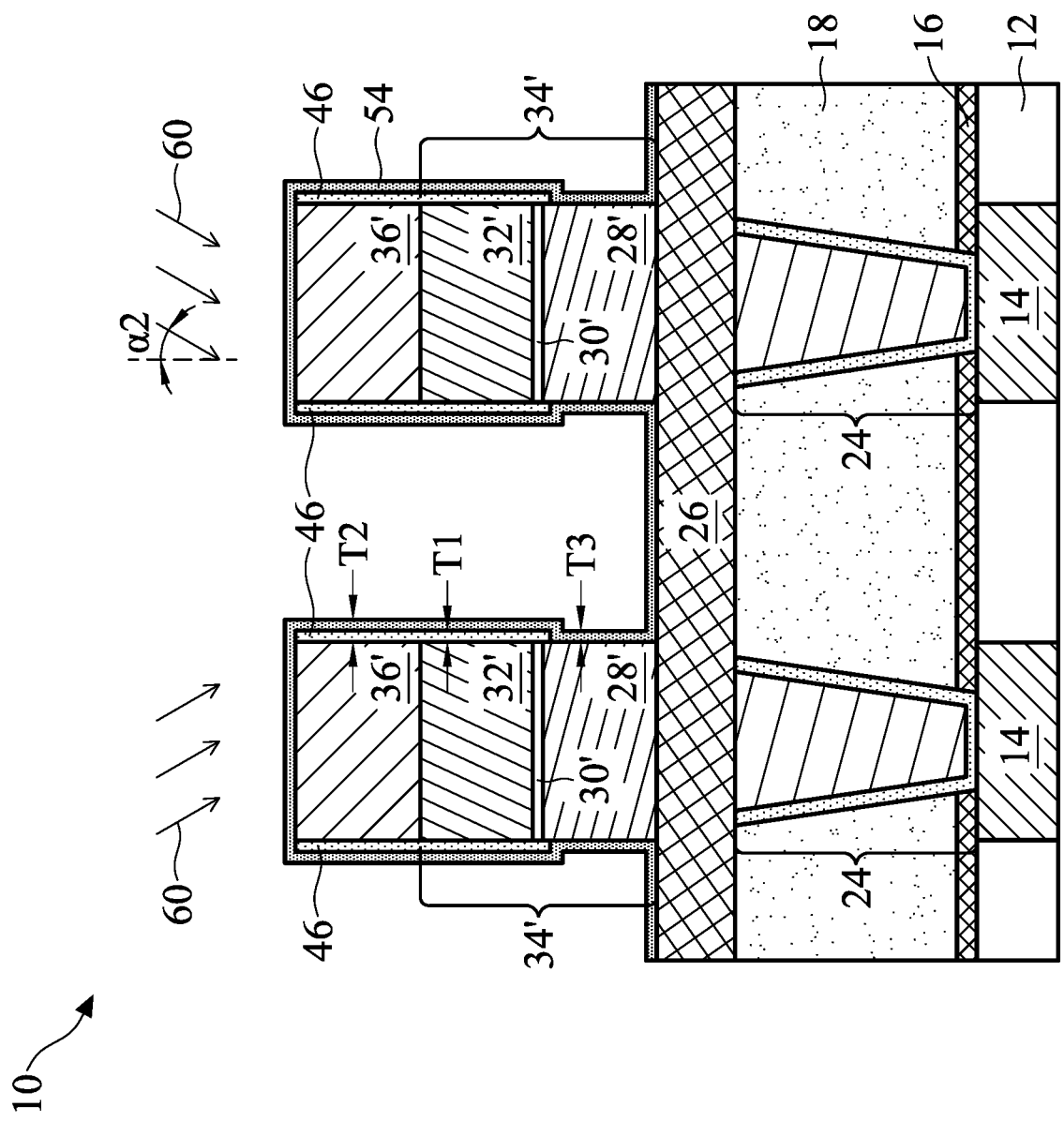

FIG. 7 illustrates the formation of a second protection layer 54 in a second passivation process, wherein the second passivation process is illustrated by arrows 60. The respective process is illustrated as process 212 in the process flow 200 shown in FIG. 13. The resulting protection layer 54 includes portions on the exposed portions of bottom electrode layer 26, sidewalls of magnetic electrodes 28', sidewalls of tunnel barriers 30', and the sidewalls and top surfaces of top electrodes 36'. It is appreciated that although protection layers 54 and 46 are illustrated as separate layers, these two layers may merge since the elements added in the second protection layer may diffuse into protection layer 46. Furthermore, since the elements introduced in the second passivation process may be the same as (or different from) the elements introduced in the first passivation process, protection layers 46 and 54 may or may not be distinguishable through analyzing their compositions. The resulting effect is that the top portions of the protection layers 46 and 54 in combination have thicknesses T2 greater than thickness T1 of protection layer 46 alone. In accordance with some embodiments of the present disclosure, thickness T2 is in the range between about 1 nm and about 5 nm. The lower portions of protection layer 54 has thickness T3, which is the thickness of protection layer 54 alone, and thickness T3 may be in the range between about 0.5 nm and about 3 nm. In the second passivation process, the re-sputtered material 52 (FIG. 6) will also be converted into a dielectric material and form portions of protection layer 54. Furthermore, thickness T2 is greater than thicknesses T1 and T3. In accordance with some embodiments of the present disclosure, thickness difference (T2−T1) is greater than about 2 nm, and may be in the range between about 0.5 nm and about 2 nm.

Figure 5:
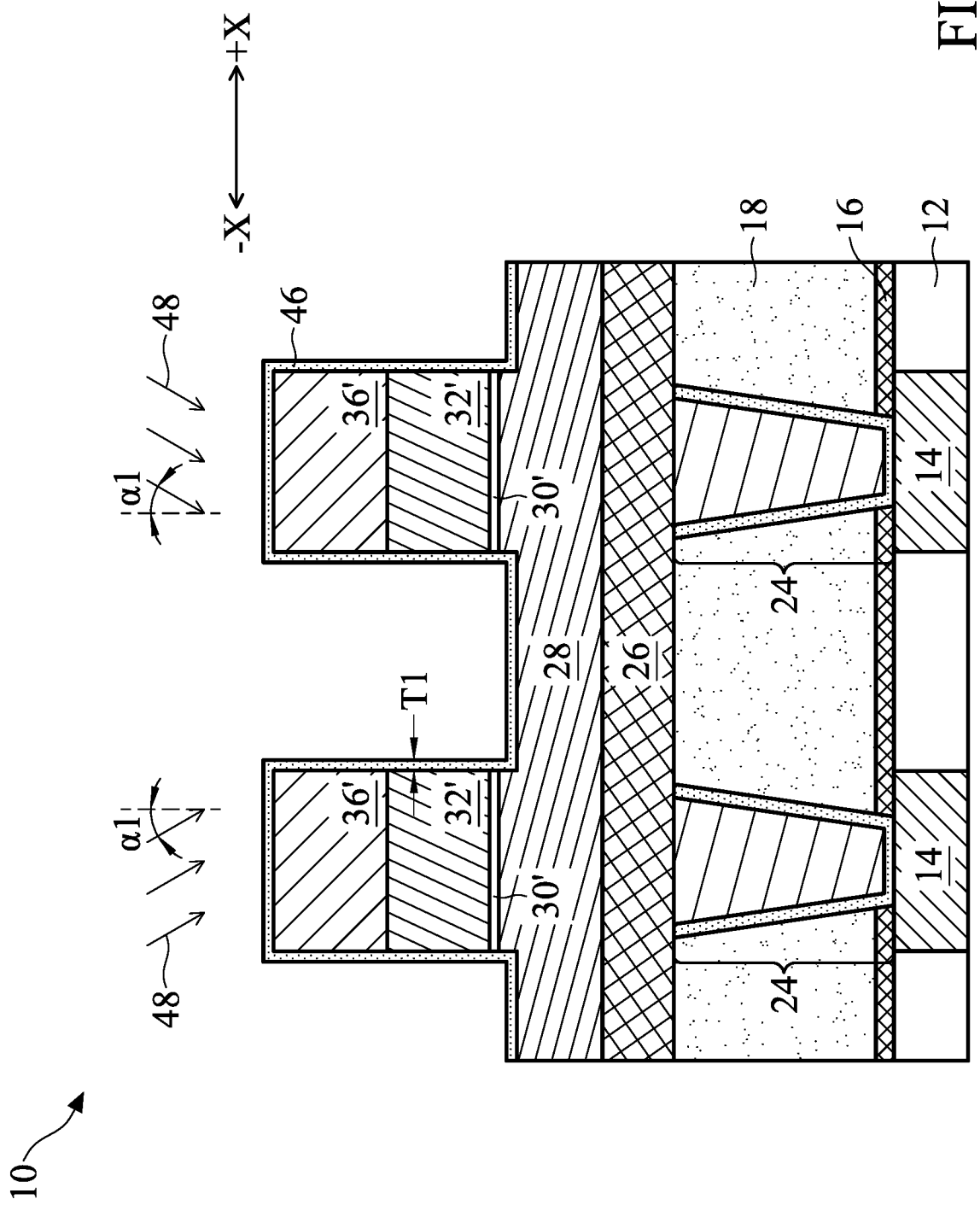

The process gases in the second passivation process may be selected from the same group of candidate gases used for the first passivation process. In addition, the process gases of the second passivation process, although selected from the same group candidate process gases, may be the same or different from the process gases used in the first passivation process. For example, in the first passivation process, more oxygen may be used, and the process gases may have less nitrogen than the first passivation process, or may be free from nitrogen. The process conditions of the second passivation process may also be similar to the first passivation process, for example, with similar main power range and similar bias energy range. The second passivation process may also be tilted, with tilt angle α2 in the similar range as tilt angle α1 (FIG. 5).

Figure 8:
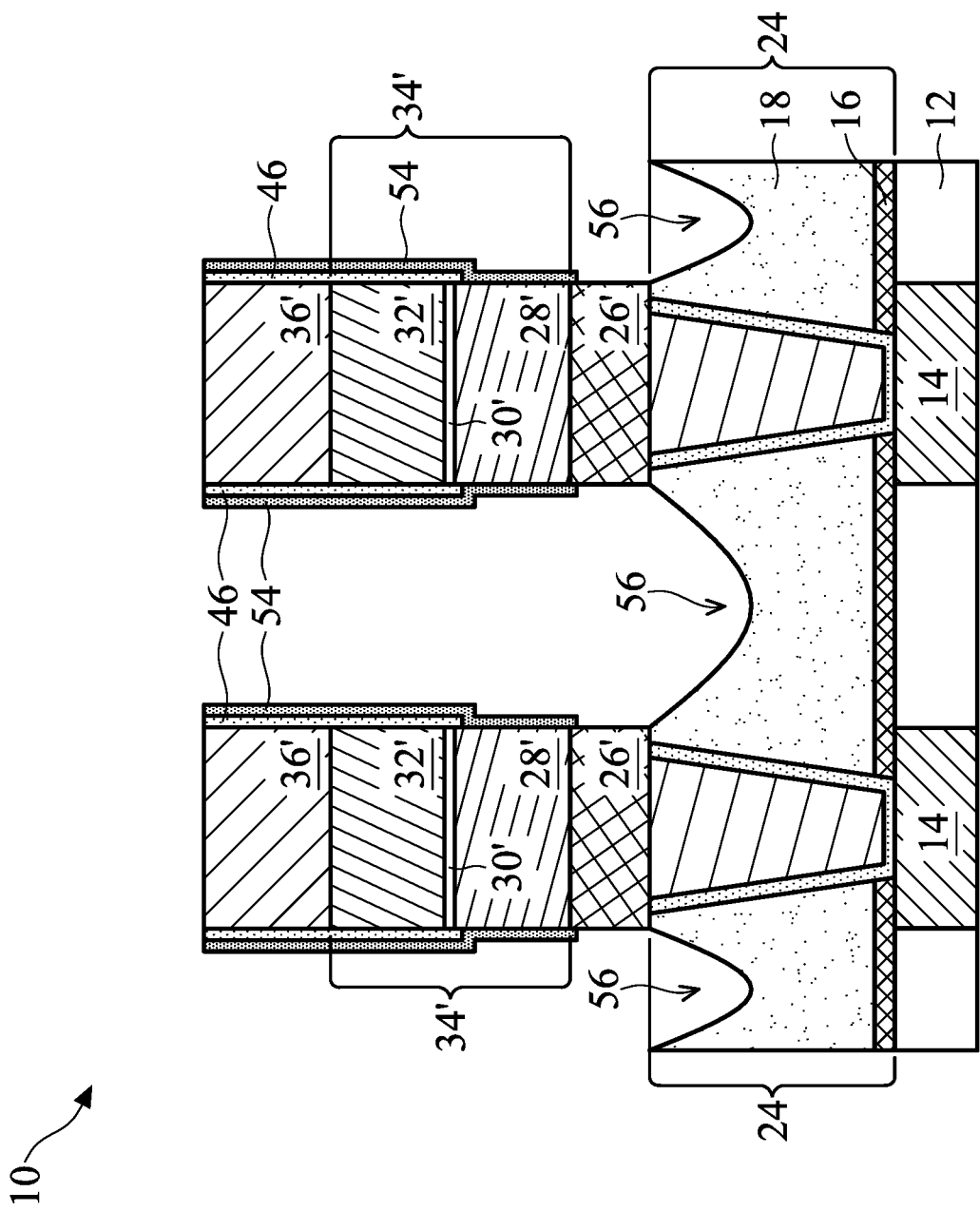

In a subsequent process, bottom electrode layer 26 is etched to form bottom electrodes 26'. The resulting structure is shown in FIG. 8. The respective process is illustrated as process 214 in the process flow 200 shown in FIG. 13. The horizontal portions of protection layer 54 are also etched in the respective etching process. Dielectric layer 18 is thus exposed. The etching may be performed using an ion beam etching process (such as a reactive ion etching process). In accordance with some embodiments of the present disclosure, the etching process gases include Ar, Kr, Ne, O2, Xe, He, Methanol, or combinations thereof. In accordance with some embodiments of the present disclosure, the etching is performed with main power (for generating plasma) in the range between about 200 Watts and about 1,500 Watts. The bias energy may be in the range between about 50 eV and about 1,500 eV.

The etching of bottom electrode layer 26 includes a main etching process, in which bottom electrode layer 26 is etched-through and at least some portions of dielectric layer 18 are exposed. When the signal of the elements in dielectric layer 18 is detected, an over-etching (or trimming) is performed, which may be performed using time mode (etching for a pre-determined period of time). In the etching of bottom electrode layer 26, the material of bottom electrode layer 26 may also be re-sputtered. With the formation of protection layers 46 and 54, the re-sputtered material will not be able to contact MTJs 34', and hence will not be able to degrade MTJs 34'. As a result of the over-etching process, dielectric layer 18 may be recessed, forming recesses 56.

Figure 9:
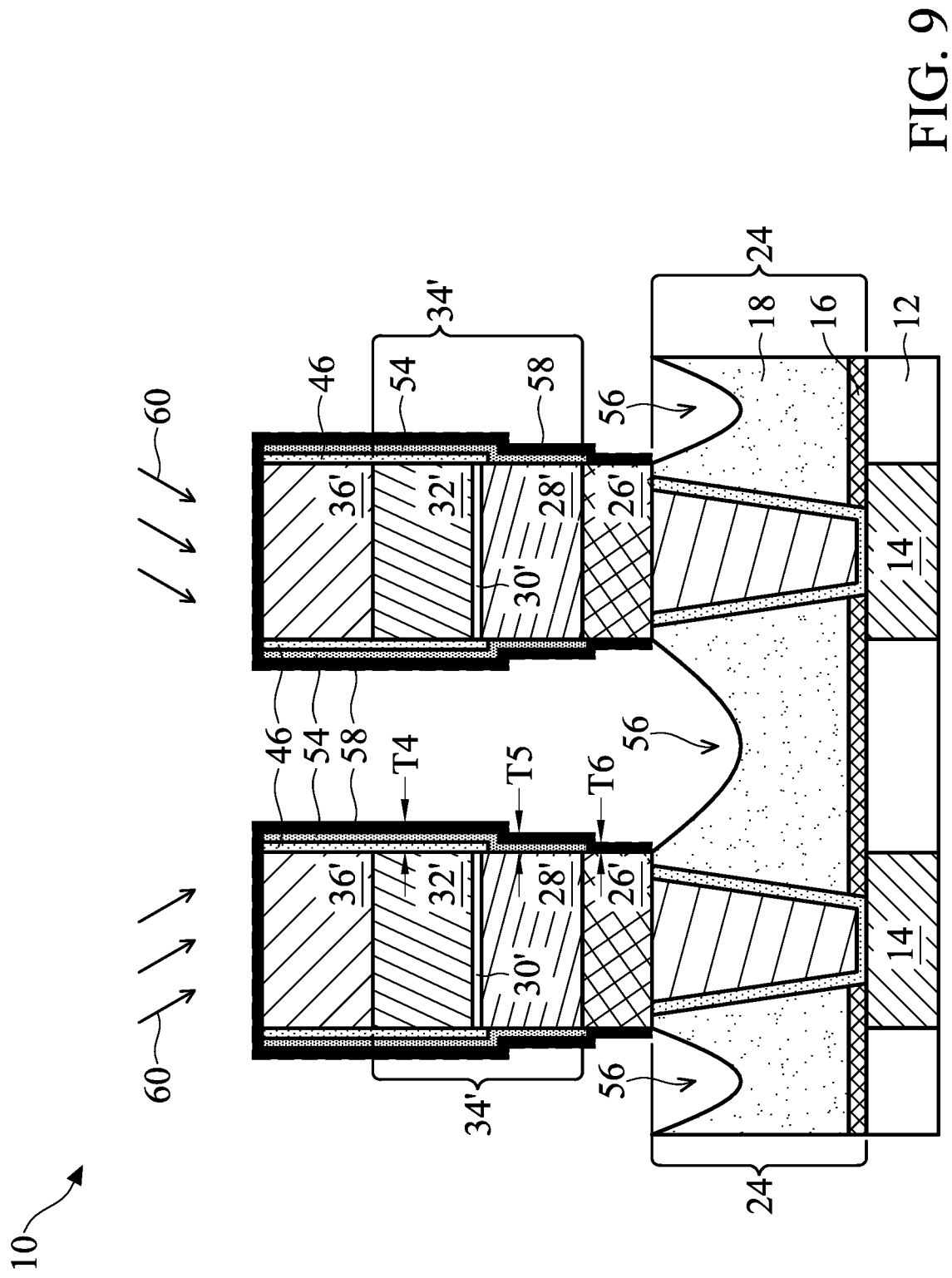

FIG. 9 illustrates a third passivation process 60 in accordance with some embodiments of the present disclosure, which forms protection layer 58. The respective process is illustrated as process 216 in the process flow 200 shown in FIG. 13. In accordance with other embodiments of the present disclosure, the third passivation process is skipped, and the subsequently formed cap dielectric layer 62 (FIG. 12A) is in contact with the sidewalls of bottom electrodes 26'. Accordingly, protection layer 58 is illustrated using dashed lines to indicate that it may be or may not be formed. The resulting protection layer 58 includes portions on the exposed portions of bottom electrodes 26', sidewalls of magnetic electrodes 28', and the sidewalls and top surfaces of top electrodes 36'. It is appreciated that although protection layer 58, 54, and 46 are illustrated as separate layers, these layers may merge since the elements added in the third protection layer are also diffused into protection layers 46 and 54. The resulting effect is that the top portions of the protection layers 58, 46, and 54 in combination have thicknesses T4 greater than thickness T2 (FIG. 7). In accordance with some embodiments of the present disclosure, thickness T4 is in the range between about 1.5 nm and about 7 nm. The lower portions of protection layer 54 and 46 in combination have thickness T5, which may be in the range between about 1 nm and about 5 nm. The lower portions of protection layer 58 have thickness T6, which may be in the range between about 0.5 nm and about 3 nm. Furthermore, thickness T4 is greater than thickness T5, which is further greater than thickness T6 of protection layer 58 alone. In accordance with some embodiments of the present disclosure, thickness difference (T4–T5) is greater than about 0.5 nm, and may be in the range between about 0.5 nm and about 2 nm. Thickness difference (T5–T6) is greater than about 0.5 nm, and may be in the range between about 0.5 nm and about 3 nm. Thickness difference (T4–T6) is greater than about 1 nm, and may be in the range between about 1 nm and about 5 nm.

The process gases used for the third passivation process may be selected from the same group of candidate gases for the first and the second passivation processes. In addition, the process gases of the third passivation process, although selected from the same group candidate process gases as the first and the second passivation processes, may be the same or different from the process gases used in the first passivation process and/or the second passivation process.

In accordance with alternative embodiments, instead of performing both the second passivation process and the third passivation process, the second passivation process is skipped, and the third passivation process is performed. Accordingly, at the time of the third passivation process is started, the sidewalls of magnetic electrodes 28' and bottom electrodes 26' are both exposed, and hence the resulting protection layer 58 is in contact with the sidewalls of both magnetic electrodes 28' and bottom electrodes 26'. In accordance with some embodiments, only one of protection layers 46, 54, and 58 is formed, all three protection layers 46, 54, and 58 is formed, or two of the protection layers 46, 54, and 58 are formed in any combination.

As aforementioned, the processes as shown in FIGS. 4 through 9 may be performed in a same etching chamber, with no vacuum break therebetween. In accordance with alternative embodiments, some or all of these processes may be performed in different process chambers, with vacuum break therebetween. In a subsequent process, wafer 10 may be removed from the etching chamber, in which processes as shown in FIGS. 4 through 9 are performed. Since the third passivation process may be performed or may not be performed, when wafer 10 is retrieved from the etching chamber, the sidewalls of bottom electrodes 26' may be covered by protection layer 58, or may be exposed.

Figure 10:
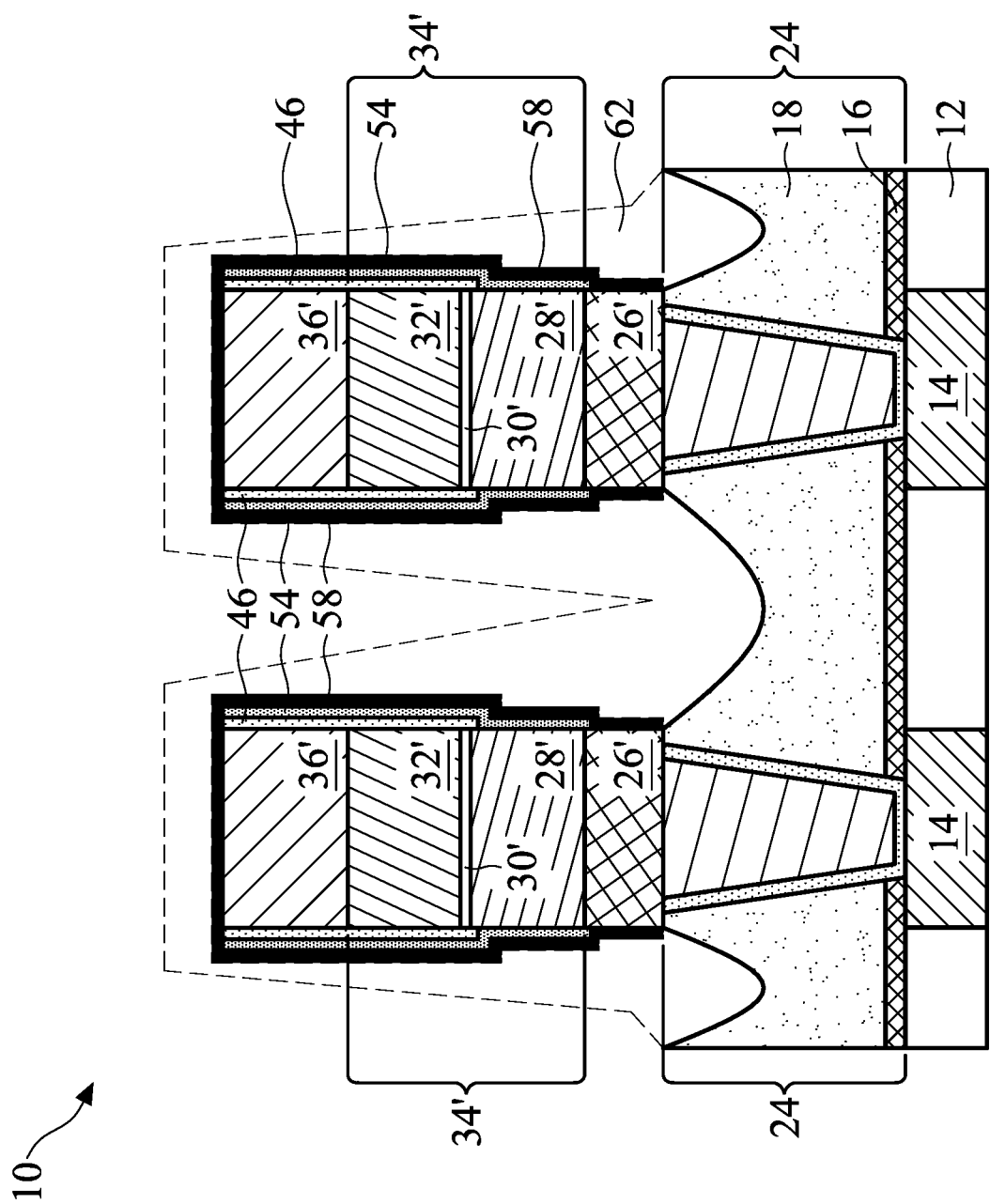
Figure 11:
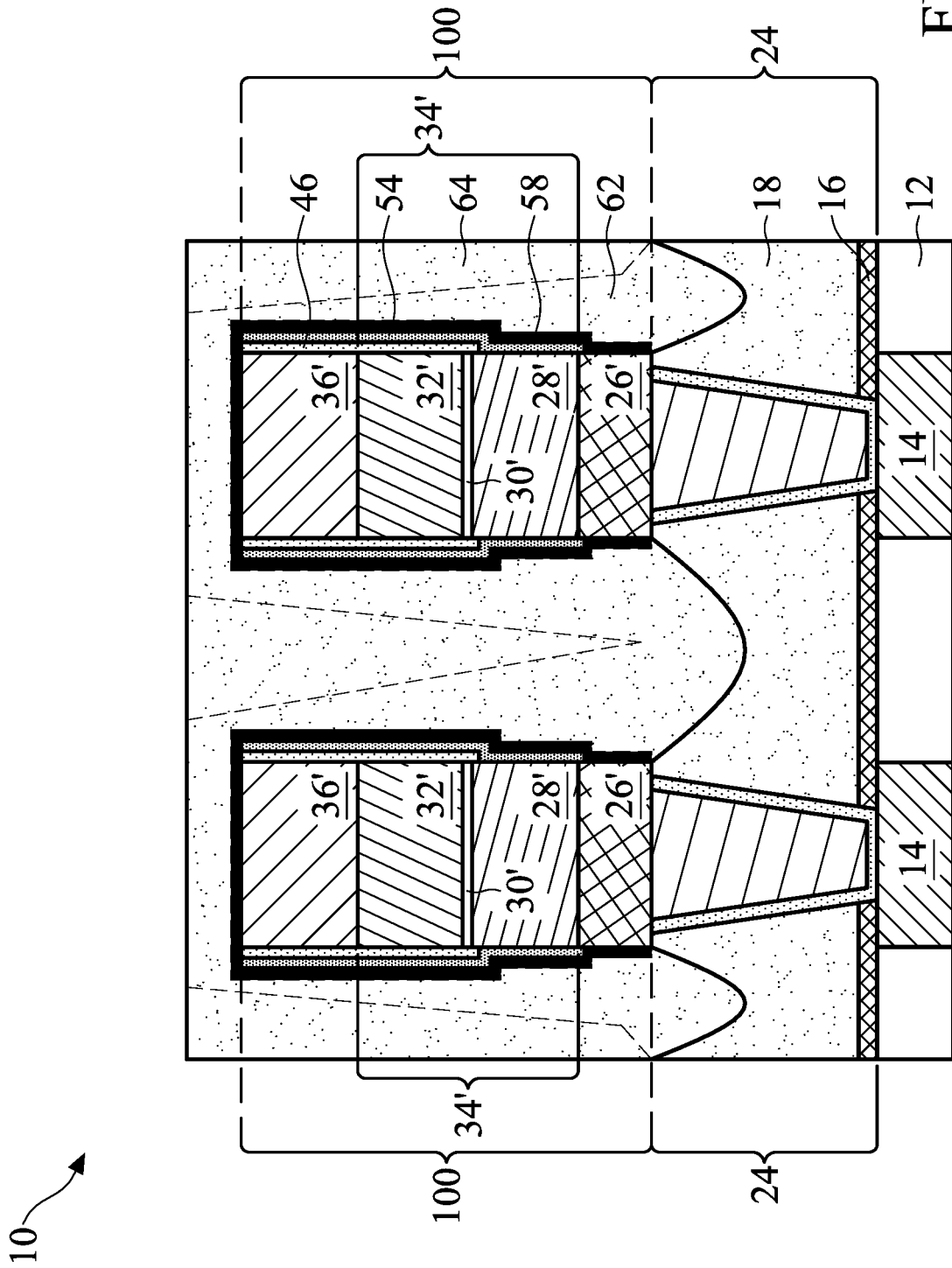

FIG. 10 illustrates the formation of cap dielectric layer 62 in accordance with some embodiments. The respective process is illustrated as process 218 in the process flow 200 shown in FIG. 13. In accordance with some embodiments of the present disclosure, cap dielectric layer 62 is formed of silicon nitride, silicon oxynitride, or the like. The formation process may be a CVD process, an ALD process, a Plasma Enhance CVD (PECVD) process, or the like. Dielectric layer 62 has the function of protecting MTJs 34' and the overlying and underlying electrodes from being degraded by detrimental substance such as chemicals and moisture. In accordance with alternative embodiments in which protection layers 46, 54, and 58 are dense enough and thick enough, and are adequate for preventing the detrimental substances from reaching MTJs 34', cap dielectric layer 62 may be skipped. For example, when thickness T4, T5, and T6 as in FIG. 9 are greater than about 2 nm, cap dielectric layer 62 is not formed. Accordingly, cap dielectric layer 62 is illustrated using dashed lines to indicate that it may be or may not be formed. Skipping cap dielectric layer 62 has the advantageous features of leaving more spaces for the subsequent gap-filling process as shown in FIG. 11, and the gap-filling is more reliable to fill the gaps fully. This also results in the possibility of further shrinking the pitches of the MRAM cells.

FIG. 11 illustrates a gap-filling process, in which dielectric material 64 is filled into the gaps between MTJs 34'. The respective process is illustrated as process 220 in the process flow 200 shown in FIG. 13. Dielectric material 64 may be a TEOS oxide, PSG, BSG, BPSG, USG, FSG, SiOCH, flowable oxide, a porous oxide, or the like, or combinations thereof. Dielectric material 64 may also be formed of a low-k dielectric material. The formation method may include CVD, PECVD, ALD, FCVD, spin-on coating, or the like. After the gap-filling process, a planarization process such as a CMP process or a mechanical grinding process may be performed. The planarization process may be stopped on the top surface of cap dielectric layer 62 or the top surfaces of top electrodes 36'. MRAM cells 100 are thus formed.

Figure 12A:
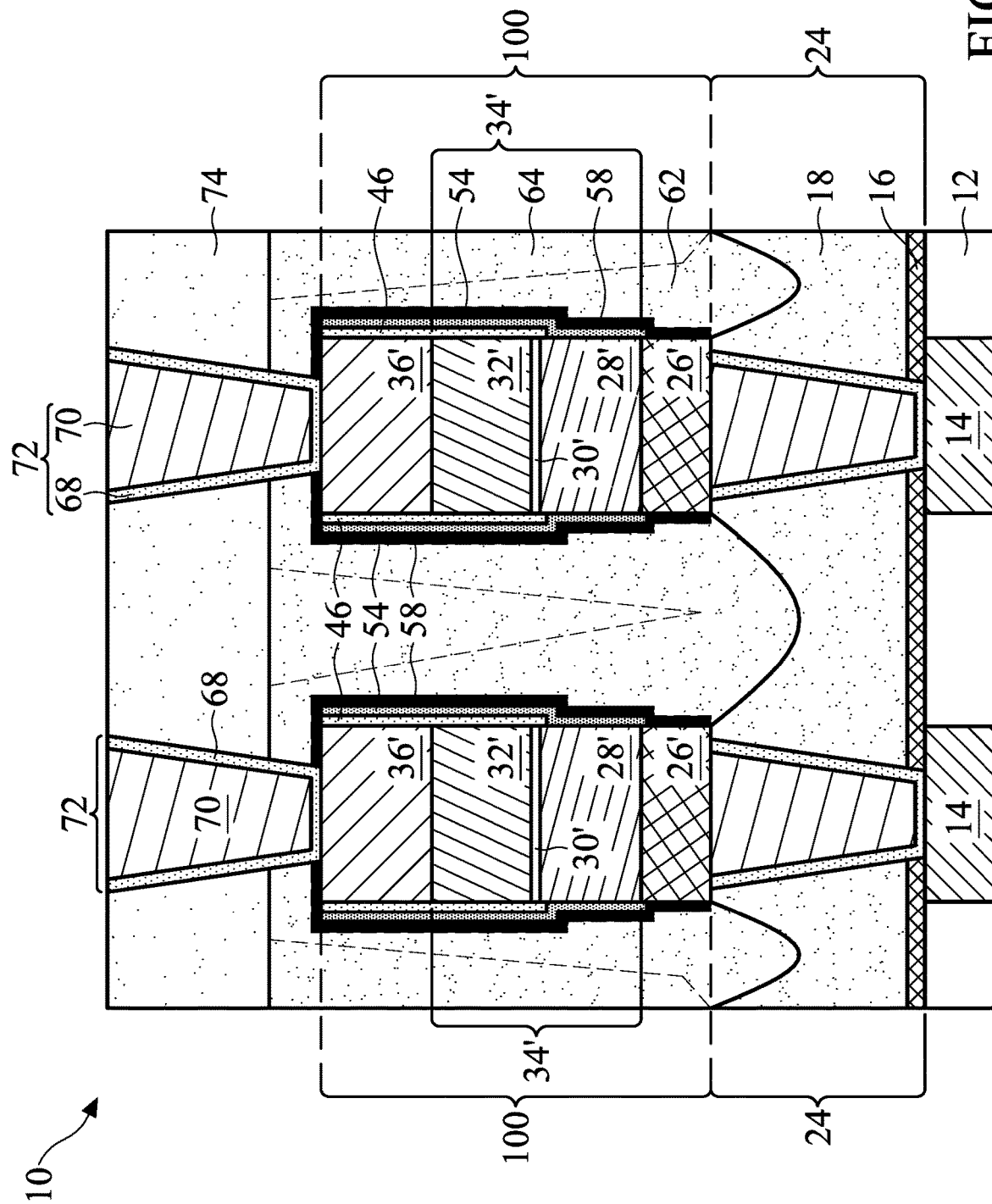
Figure 13:
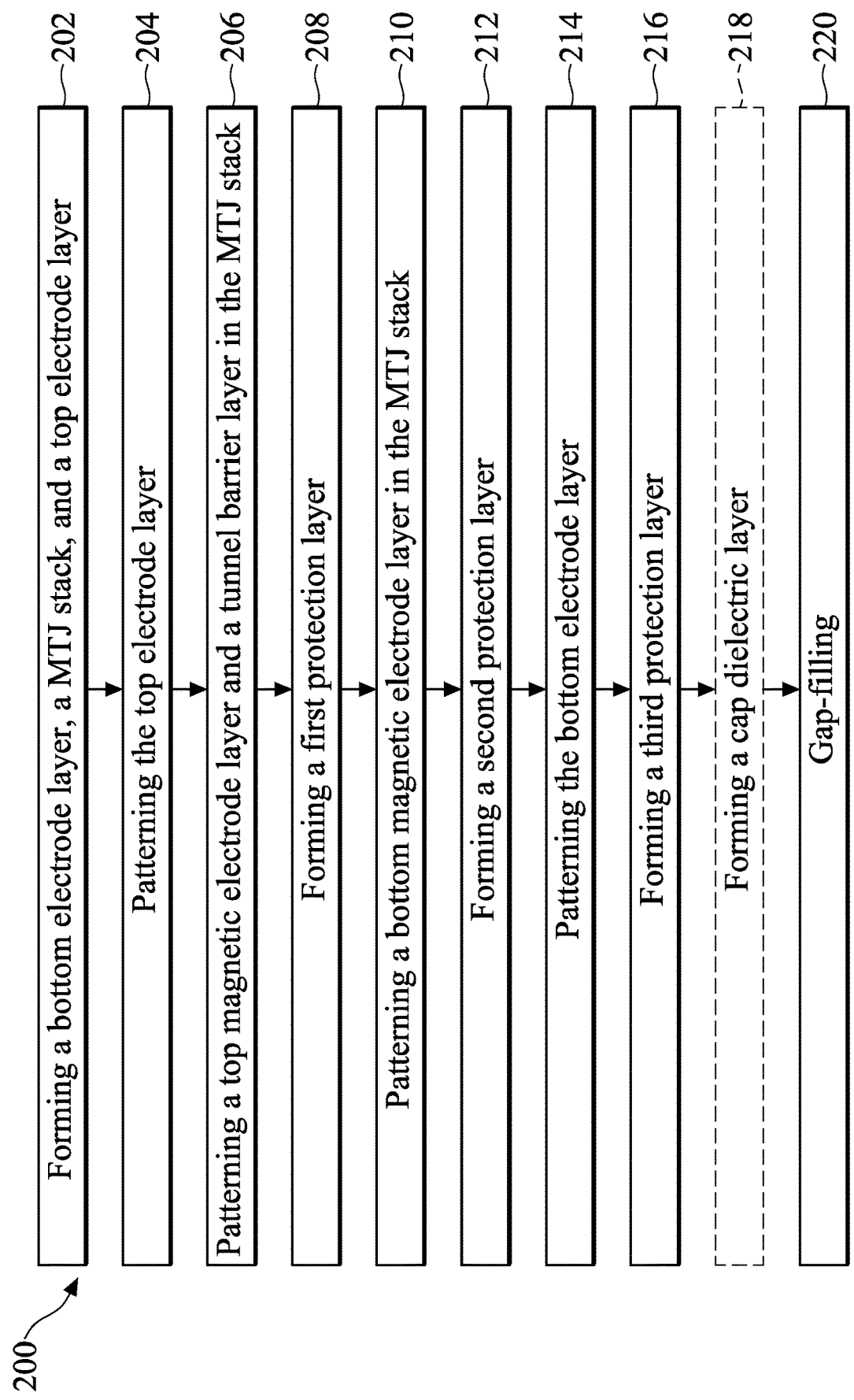
FIG. 13 illustrates a process flow for forming MRAM cells in accordance with some embodiments.

FIG. 12A illustrates the structure after the formation of conductive features 72, which may be vias, conductive lines (such as word lines or bit lines), or the like. In accordance with some embodiments of the present disclosure, conductive features 72 include barrier layers 68 and conductive regions 70 over barrier layer 68. Conductive barrier layers 68 may be formed of titanium, titanium nitride, tantalum, tantalum nitride, cobalt, or the like. Conductive regions 70 may be formed of metals such as copper, aluminum, tungsten, cobalt, or the like, or alloys of the metals. Conductive features 72 are formed in dielectric layer 74. Conductive features 72 penetrate through the dielectric portions (if any) of the top electrodes 36' (if any is remaining) to contact the conductive portions of top electrodes 36'.

Figure 12B:
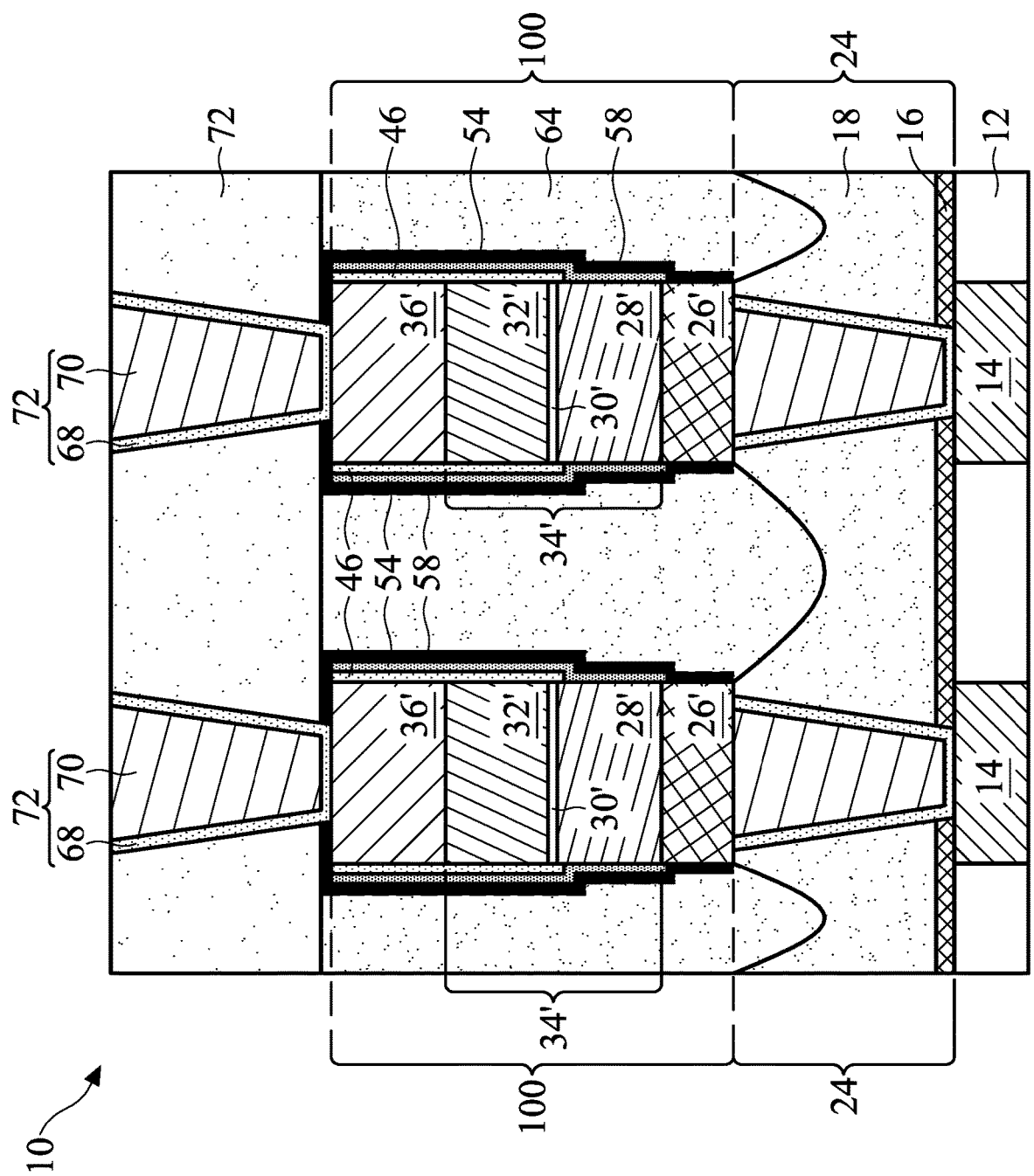
FIG. 12B illustrates a cross-sectional view of some MRAM cells in accordance with some embodiments.

FIG. 12B illustrates the MRAM cells 100 in accordance with alternative embodiments. These embodiments are similar to the embodiments as shown in FIG. 12A, except that the cap dielectric layer 62 as shown in FIG. 12A is not formed, and hence dielectric layer 64 is in contact with protection layer(s) 54 or 58 (depending on which passivation process is skipped or not skipped).

The embodiments of the present disclosure have some advantageous features. By forming protection layers in certain patterning steps of the MTJ formation process, the re-sputter occurring in the etching processes of some layers does not affect the reliability of the MRAM cells. The protection layers may be formed in the same process chamber for etching processes, and hence the manufacturing cost is low. Furthermore, the resulting protection layers may be dense and thin, and hence there is no need to form dielectric layer to protect the MRAM cells, making the gap-filling process less difficult, and the further shrinking of the MRAM array becomes possible.

In accordance with some embodiments of the present disclosure, a method comprises forming MTJ stack layers comprising depositing a bottom electrode layer; depositing a bottom magnetic electrode layer over the bottom electrode layer; depositing a tunnel barrier layer over the bottom magnetic electrode layer; depositing a top magnetic electrode layer over the tunnel barrier layer; and depositing a top electrode layer over the top magnetic electrode layer; patterning the MTJ stack layers to form a MTJ; and performing a first passivation process on a sidewall of the MTJ to form a first protection layer, wherein the first passivation process comprises reacting sidewall surface portions of the MTJ with a process gas comprising elements selected from the group consisting of oxygen, nitrogen, carbon, and combinations thereof. In an embodiment, the patterning the MTJ stack layers comprises: etching the top electrode layer, the top magnetic electrode layer, and the tunnel barrier layer, wherein the first passivation process is performed after the top electrode layer, the top magnetic electrode layer, and the tunnel barrier layer are etched, and before at least a majority of the bottom magnetic electrode layer is etched. In an embodiment, the method further comprises, after the first passivation process, etching the bottom magnetic electrode layer; and performing a second passivation process to form a second protection layer, wherein the second protection layer extends on sidewalls of a remaining portion of the bottom magnetic electrode layer. In an embodiment, the method further comprises, after the second passivation process, etching the bottom electrode layer; and performing a third passivation process to form a third protection layer, wherein the third protection layer extends on sidewalls of a remaining portion of the bottom electrode layer. In an embodiment, the patterning the MTJ stack layers is performed in an etching chamber, and the first passivation process is performed in the etching chamber. In an embodiment, the patterning the MTJ stack layers and the first passivation process are in-situ performed without vacuum break therebetween. In an embodiment, the first passivation process comprises tilted treatments using the process gas, with the tilted treatments tilted in opposite directions. In an embodiment, the process gas is selected from the group consisting of $O_2$, $N_2$, CO, $CO_2$, $CH_3OH$, and combinations thereof, with plasma turned on in the first passivation process, and a bias power applied. In an embodiment, the method further comprises depositing a blanket dielectric layer, wherein the blanket dielectric layer comprises portions on opposite sides of the first protection layer; and depositing a gap-filling dielectric material on the blanket dielectric layer. In an embodiment, the method further comprises depositing a gap-filling dielectric material, with no blanket dielectric being formed using deposition between the gap-filling dielectric material and the MTJ.

In accordance with some embodiments of the present disclosure, a method comprises etching a top electrode layer to form a top electrode; etching a top magnetic electrode layer underlying the top electrode layer to form a top magnetic electrode; etching a tunnel barrier layer underlying the top magnetic electrode layer to form a tunnel barrier; performing a first passivation process on sidewalls of the top electrode, the top magnetic electrode, and the tunnel barrier to form a first protection layer; etching a bottom magnetic electrode layer underlying the tunnel barrier to form a bottom magnetic electrode; and performing a second passivation process on sidewalls of the bottom magnetic electrode to form a second protection layer, wherein each of the first passivation process and the second passivation process comprises a process selected from the group consisting of an oxidation process, a carbonization process, a nitridation process, and combinations thereof. In an embodiment, the first passivation process comprises oxidizing surface portions the top magnetic electrode, the top magnetic electrode, and the tunnel barrier to form a metal oxide. In an embodiment, the first passivation process comprises nitridating surface portions the top magnetic electrode, the top magnetic electrode, and the tunnel barrier to form a metal nitride. In an embodiment, the first passivation process comprises carbonating surface portions the top magnetic electrode, the top magnetic electrode, and the tunnel barrier to form a metal carbide. In an embodiment, the method further comprises etching a bottom electrode layer underlying the bottom magnetic electrode to form a bottom electrode; and performing a third passivation process on sidewalls of the bottom electrode to form a third protection layer. In an embodiment, when the second passivation process is performed, the first protection layer is exposed.

In accordance with some embodiments of the present disclosure, a device comprises a MTJ stack comprising a bottom electrode; a bottom magnetic electrode over the bottom electrode; a tunnel barrier over the bottom magnetic electrode; a top magnetic electrode over the tunnel barrier; and a top electrode over the top magnetic electrode; a dielectric protection layer on a sidewall of the MTJ, wherein the dielectric protection layer comprises: a first portion on a sidewall of the top magnetic electrode, wherein the first portion comprises materials of the top magnetic electrode and additional elements; a second portion on a sidewall of the tunnel barrier, wherein the second portion comprises materials of the tunnel barrier and the additional elements; and a third portion on a sidewall of a top portion of the bottom magnetic electrode, wherein the third portion comprises materials of the bottom magnetic electrode and the additional elements. In an embodiment, the dielectric protection layer further comprises a fourth portion on a sidewall of a middle portion and a bottom portion of the bottom magnetic electrode, wherein the fourth portion has a thickness smaller than thicknesses of the first portion and the second portion. In an embodiment, the dielectric protection layer further comprises a fifth portion on a sidewall of the bottom electrode, wherein the fifth portion has a thickness smaller than the thickness of the fourth portion. In an embodiment, the additional elements are selected from the group consisting of oxygen, carbon, nitrogen, and combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
forming Magnetic Tunnel Junction (MTJ) stack layers comprising:
depositing a bottom electrode layer;
depositing a bottom magnetic electrode layer over the bottom electrode layer;
depositing a tunnel barrier layer over the bottom magnetic electrode layer;
depositing a top magnetic electrode layer over the tunnel barrier layer; and
depositing a top electrode layer over the top magnetic electrode layer;
performing a first etching process to etch an upper portion of the MTJ stack layers, wherein a first conductive material of the upper portion is re-sputtered to a sidewall of a remaining part of the upper portion; and
performing a first passivation process to convert the first conductive material to a first dielectric protection layer.
2. The method of claim 1, wherein the first etching process results in the tunnel barrier layer to be etched, and an edge of the tunnel barrier layer is exposed after the first etching process.

3. The method of claim 1, wherein the first passivation process comprises an oxidation process of the first conductive material, a nitridation process of the first conductive material, a carbonation process of the first conductive material, and combinations thereof.
4. The method of claim 1, wherein the first passivation process is performed with plasma being generated from a process gas used for the first passivation process.
5. The method of claim 4, wherein the process gas is selected from the group consisting of $O_2$, $N_2$, CO, $CO_2$, $CH_3OH$, and combinations thereof.
6. The method of claim 1 further comprising:
after the first passivation process, performing a second etching process to further etch the MTJ stack layers, wherein a second conductive material of a lower portion of the MTJ stack layers etched by the second etching process is re-sputtered onto the first dielectric protection layer; and
performing a second passivation process to convert the second conductive material as a second dielectric protection layer.
7. The method of claim 6 further comprising:
after the first passivation process, performing a third etching process to further etch the MTJ stack layers; and
performing a third passivation process to convert a third conductive material re-sputtered on the second dielectric protection layer as a third dielectric protection layer.
8. The method of claim 1 further comprising:
after the first passivation process, forming a dielectric capping layer; and
performing a gap-fill process to fill gaps between portions of the dielectric capping layer.
9. The method of claim 1, wherein the first dielectric protection layer comprises horizontal portions and vertical portions, and the method further comprises removing the horizontal portions of the first dielectric protection layer.
10. The method of claim 1, wherein in the first passivation process, entireties of the first conductive material that are re-sputtered are converted to dielectric material.
11. The method of claim 1, wherein the first passivation process comprises reacting sidewall surface portions of etched portions of the MTJ stacked layers with a process gas comprising an element selected from the group consisting of oxygen, nitrogen, carbon, and combinations thereof, and wherein the first dielectric protection layer comprises an inner surface contacting the MTJ stack layers, and an outer surface opposing to the inner surface, and wherein the element is distributed from the inner surface to the outer surface of the first dielectric protection layer.
12. A method comprising:
etching a top electrode layer to form a top electrode;
etching a top magnetic electrode layer underlying the top electrode layer to form a top magnetic electrode;
etching a tunnel barrier layer underlying the top magnetic electrode layer to form a tunnel barrier;
performing a first passivation process to form a first dielectric protection layer on a sidewall of the tunnel barrier;
etching a bottom magnetic electrode layer underlying the tunnel barrier to form a bottom magnetic electrode, wherein a first conductive material of the bottom magnetic electrode layer is re-sputtered on the first dielectric protection layer; and
performing a second passivation process on sidewalls of the bottom magnetic electrode to form a second protection layer, wherein the first conductive material is passivated as a dielectric material of the second protection layer.

13. The method of claim 12, wherein the first dielectric protection layer is further on sidewalls of the top electrode and the top magnetic electrode.

14. The method of claim 12, wherein the first passivation process is selected from an oxidation process, a nitridation process, a carbonation process, and combinations thereof.

15. The method of claim 14, wherein the second passivation process is selected from an additional nitridation process, an additional carbonation process, and combinations thereof.

16. The method of claim 14, wherein the first passivation process comprises oxidizing surface portions of the top electrode, the top magnetic electrode, and the tunnel barrier to form oxides.

17. The method of claim 12, wherein the first passivation process comprises tilted treatment processes.

18. A method comprising:
    depositing a bottom electrode layer;
    depositing a bottom magnetic electrode layer over the bottom electrode layer;
    forming stacked layers comprising:
        a tunnel barrier over the bottom magnetic electrode layer;
        a top magnetic electrode over the tunnel barrier; and
        a top electrode over the top magnetic electrode;
    performing a first passivation process to form a first protection layer on sidewalls of the stacked layers; after the first passivation process, etching the bottom magnetic electrode layer to form a bottom magnetic electrode; and
    performing a second passivation process to form a second protection layer on sidewalls of the bottom magnetic electrode, wherein the second passivation process converts a metal-containing material on the first protection layer as a dielectric material.

19. The method of claim 18, wherein the metal-containing material is re-sputtered on the first protection layer from the bottom magnetic electrode layer when the bottom magnetic electrode layer is etched.

20. The method of claim 18, wherein the first passivation process converts a material re-sputtered from the bottom magnetic electrode layer as the dielectric material.

* * * * *